(12) United States Patent
Yamamoto et al.

(10) Patent No.: US 9,320,173 B2
(45) Date of Patent: Apr. 19, 2016

(54) SEMICONDUCTOR DEVICE HAVING A BULGE PORTION AND MANUFACTURING METHOD THEREFOR

(71) Applicants: Kei Yamamoto, Tokyo (JP); Kazuhiro Tada, Tokyo (JP)

(72) Inventors: Kei Yamamoto, Tokyo (JP); Kazuhiro Tada, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/374,363

(22) PCT Filed: Feb. 18, 2013

(86) PCT No.: PCT/JP2013/053811
§ 371 (c)(1),
(2) Date: Jul. 24, 2014

(87) PCT Pub. No.: WO2013/125474
PCT Pub. Date: Aug. 29, 2013

(65) Prior Publication Data
US 2015/0016064 A1    Jan. 15, 2015

(30) Foreign Application Priority Data
Feb. 24, 2012  (JP) ................................ 2012-038117

(51) Int. Cl.
*H01L 23/00* (2006.01)
*H01L 21/56* (2006.01)
(Continued)

(52) U.S. Cl.
CPC ............ *H05K 7/20409* (2013.01); *H01L 21/56* (2013.01); *H01L 21/565* (2013.01);
(Continued)

(58) Field of Classification Search
CPC ............ H01L 23/3107; H01L 23/4334; H01L 23/49568; H01L 23/49575; H01L 23/3672; H01L 2224/73265; H01L 2224/48091; H01L 2224/48147; H01L 2224/48247; H01L 2924/01004; H01L 2924/13055; H01L 2924/13091; H01L 2924/1532; H01L 2224/32245; H01L 2224/48137; H01L 2224/451; H01L 2924/1301; H01L 2924/1305
USPC ......... 257/666, 667, 668, 691, 692, 693, 696, 257/713, 676, 707, 717, 719, 720; 361/719; 438/124
See application file for complete search history.

(56) References Cited

U.S. PATENT DOCUMENTS 5,533,257 A * 7/1996 Romero et al. ............ 29/890.03
5,542,146 A * 8/1996 Hoekstra et al. ................ 15/319
(Continued)

FOREIGN PATENT DOCUMENTS

JP    4-129253 A    4/1992
JP    8 298299    11/1996
(Continued)

OTHER PUBLICATIONS

International Search Report Issued May 7, 2013 in PCT/JP13/053811 Filed Feb. 18, 2013.
(Continued)

*Primary Examiner* — Alexander Oscar Williams
(74) *Attorney, Agent, or Firm* — Oblon, McClelland, Maier & Neustadt, L.L.P.

(57) ABSTRACT

A semiconductor device includes a base plate having a first major plane and a second major plane opposite to each other, and having a plurality of fins held upright on the first major plane and a bulge portion formed on the first major plane to encircle the plurality of fins, an insulation layer formed on the second major plane of the base plate, a circuit pattern fixed to the insulation layer, a semiconductor element connected to the circuit pattern, and a sealing resin sealing the insulation layer, the circuit pattern, and the semiconductor element. The bulge portion formed on the first major plane continuously encircles the plurality of fins, the bulge portion has a widthwise margin on an outer peripheral edge of the base plate, and the sealing resin covers an outer peripheral side face of the bulge portion and the widthwise margin.

13 Claims, 10 Drawing Sheets

(51) Int. Cl.
  *H05K 7/20* (2006.01)
  *H01L 23/31* (2006.01)
  *H01L 23/367* (2006.01)
  *H01L 23/433* (2006.01)
  *H01L 23/495* (2006.01)
  *H01L 25/07* (2006.01)

(52) U.S. Cl.
  CPC .......... *H01L23/3107* (2013.01); *H01L 23/367* (2013.01); *H01L 23/4334* (2013.01); *H01L 24/83* (2013.01); *H01L 23/49568* (2013.01); *H01L 25/072* (2013.01); *H01L 2224/48091* (2013.01); *H01L 2224/48137* (2013.01); *H01L 2224/48227* (2013.01); *H01L 2224/83951* (2013.01); *H01L 2924/15787* (2013.01); *H01L 2924/181* (2013.01); *H01L 2924/351* (2013.01)

(56) References Cited

U.S. PATENT DOCUMENTS

| | | | |
|---|---|---|---|
| 8,659,147 B2 * | 2/2014 | Mitsui et al. | 257/713 |
| 2012/0112236 A1 * | 5/2012 | Higuma et al. | 257/98 |

FOREIGN PATENT DOCUMENTS

| | | | |
|---|---|---|---|
| JP | 11-150216 | A | 6/1999 |
| JP | 2002-110867 | A | 4/2002 |
| JP | 2003 174129 | | 6/2003 |
| JP | 2009 33065 | | 2/2009 |
| JP | 2009 177038 | | 8/2009 |
| JP | 2010 199494 | | 9/2010 |
| JP | 2011 119488 | | 6/2011 |
| JP | 2011 238644 | | 11/2011 |
| JP | 2011-258594 | A | 12/2011 |
| JP | 2012-28421 | A | 2/2012 |
| JP | 2012 28561 | | 2/2012 |
| JP | 2012 164763 | | 8/2012 |
| JP | 2012 174734 | | 9/2012 |

OTHER PUBLICATIONS

U.S. Appl. No. 14/370,803, filed Jul. 7, 2014, Yamamoto, et al.
Office Action issued Aug. 25, 2015 in Japanese Patent Application No. 2014-500698 (with Partial English translation).
Office Action issued Dec. 9, 2015 in German Patent Application No. 11 2012 005 791.0 (with English Translation).

* cited by examiner

Fig. 12

| | | Example 1 | Example 2 | Example 3 | Example 4 | Example 5 | Example 6 | Example 7 | Example 8 |
|---|---|---|---|---|---|---|---|---|---|
| Fin Dimension | Dim. Variations (mm) | ±0.05 | ±0.05 | ±0.05 | ±0.05 | ±0.05 | ±0.05 | ±0.05 | ±0.05 |
| Distance from Placing Stage to Bottom of Lower Die | Design Height (mm) | 3 | 3 | 3 | 3 | 3 | 3 | 3 | 3 |
| Bulge Portion | Width (mm) | 1 | 0.5 | 0.5 | 0.5 | 0.5 | 0.5 | 0.5 | 0.5 |
| | Height (mm) | 0.5 | 0.1 | 0.2 | 0.5 | 1 | 2 | 0.5 | 0.5 |
| | Top Shape | Triangle | Triangle | Triangle | Triangle | Triangle | Triangle | Half-circle | Rectangular |
| | Productivity | ○ | ○ | ○ | ○ | ○ | △ | ○ | ○ |
| Contact of Bulge Portion with Die (Sealing Performance) | No Resin Leakage: ○ Partial Resin Leakage: × | ○ | ○ | ○ | ○ | ○ | ○ | ○ | ○ |
| Warp of Base Plate (After Molding) | No Deformation: ○ Deformed Slightly: △ Deformed: × | ○ | ○ | ○ | ○ | ○ | ○ | ○ | ○ |

Fig. 13

| | | Example 9 | Example 10 | Example 11 | Example 12 | Example 13 | Example 14 | Example 15 | Example 16 |
|---|---|---|---|---|---|---|---|---|---|
| Fin Dimension | Dim. Variations (mm) | ±0.05 | ±0.05 | ±0.05 | ±0.05 | ±0.05 | ±0.05 | ±0.05 | ±0.05 |
| Distance from Placing Stage to Bottom of Lower Die | Design Height (mm) | 3 | 3 | 3 | 3 | 3 | 3 | 3 | 3 |
| Bulge Portion | Width (mm) | 0.2 | 0.2 | 0.2 | 2 | 2 | 2 | 2 | 2 |
| | Height (mm) | 0.1 | 0.5 | 1 | 0.1 | 0.5 | 1 | 1 | 2 |
| | Top Shape | Triangle | Triangle | Triangle | Triangle | Triangle | Triangle | Half-circle | Triangle |
| | Productivity | ○ | △ | △ | ○ | ○ | ○ | ○ | ○ |
| Contact of Bulge Portion with Die (Sealing Performance) | No Resin Leakage: ○ Partial Resin Leakage: × | ○ | ○ | ○ | ○ | ○ | ○ | ○ | ○ |
| Warp of Base Plate (After Molding) | No Deformation: ○ Deformed Slightly: △ Deformed: × | ○ | ○ | ○ | ○ | ○ | ○ | △ | △ |

Fig. 14

| | | Example 17 | Example 18 | Example 19 | Example 20 | Example 21 | Example 22 | Example 23 | Example 24 |
|---|---|---|---|---|---|---|---|---|---|
| Fin Dimension | Dim. Variations (mm) | ±0.02 | ±0.02 | ±0.02 | ±0.02 | ±0.02 | ±0.02 | ±0.02 | ±0.02 |
| Distance from Placing Stage to Bottom of Lower Die | Design Height (mm) | 3 | 3 | 3 | 3 | 3 | 3 | 3 | 3 |
| Bulge Portion | Width (mm) | 0.5 | 0.5 | 0.5 | 0.2 | 0.2 | 0.2 | 2 | 2 |
| | Height (mm) | 0.1 | 1 | 2 | 0.1 | 1 | 2 | 0.1 | 1 |
| | Top Shape | Triangle | Triangle | Triangle | Triangle | Triangle | Triangle | Half-circle | Triangle |
| | Productivity | ○ | ○ | △ | ○ | △ | △ | ○ | ○ |
| Contact of Bulge Portion with Die (Sealing Performance) | No Resin Leakage: ○ Partial Resin Leakage: × | ○ | ○ | ○ | ○ | ○ | ○ | ○ | ○ |
| Warp of Base Plate (After Molding) | No Deformation: ○ Deformed Slightly: △ Deformed: × | ○ | ○ | ○ | ○ | ○ | ○ | △ | △ |

Fig. 15

| | | Example 25 | Example 26 | Example 27 | Example 28 | Example 29 | Example 30 | Example 31 | Example 32 |
|---|---|---|---|---|---|---|---|---|---|
| Fin Dimension | Dim. Variations (mm) | ±0.02 | ±0.2 | ±0.2 | ±0.2 | ±0.2 | ±0.2 | ±0.2 | ±0.2 |
| Distance from Placing Stage to Bottom of Lower Die | Design Height (mm) | 3 | 3 | 3 | 3 | 3 | 3 | 3 | 3 |
| Bulge Portion | Width (mm) | 2 | 0.5 | 0.5 | 0.5 | 0.2 | 0.2 | 2 | 2 |
| | Height (mm) | 2 | 0.2 | 1 | 2 | 1 | 2 | 1 | 2 |
| | Top Shape | Triangle | Triangle | Triangle | Triangle | Triangle | Triangle | Triangle | Triangle |
| | Productivity | ○ | ○ | ○ | △ | △ | △ | ○ | ○ |
| Contact of Bulge Portion with Die (Sealing Performance) | No Resin Leakage: ○ Partial Resin Leakage: × | ○ | ○ | ○ | ○ | ○ | ○ | ○ | ○ |
| Warp of Base Plate (After Molding) | No Deformation: ○ Deformed Slightly: △ Deformed: × | △ | ○ | ○ | ○ | ○ | ○ | △ | △ |

Fig. 16

|  |  | Comparative Example 1 | Comparative Example 2 | Comparative Example 3A | Comparative Example 3B | Comparative Example 3C | Comparative Example 4 | Comparative Example 5 | Comparative Example 6 |
|---|---|---|---|---|---|---|---|---|---|
| Fin Dimension | Dim. Variations (mm) | ±0.05 | ±0.05 | ±0.05 | ±0.05 | ±0.05 | ±0.05 | ±0.05 | ±0.05 |
| Distance from Placing Stage to Bottom of Lower Die | Design Height (mm) | 3 | 3.05 | 3.05 | 3.05 | 3.05 | 3 | 3 | 3 |
| Bulge Portion | Width (mm) | 0 | 0 | 1 | 1 | 3 | 1 | 1 | 2 |
|  | Height (mm) | 0 | 0 | 0.1 | 1 | 0.5 | 0.02 | 0.5 | 1 |
|  | Top Shape | — | — | Rectangular | Rectangular | Rectangular | Triangle | Rectangular | Rectangular |
|  | Productivity | ◎ | ◎ | ○ | ○ | ○ | ○ | ○ | ○ |
| Contact of Bulge Portion with Die (Sealing Performance) | No Resin Leakage: ○ Partial Resin Leakage: × | × | ○ | × | ○ | ○ | × | ○ | ○ |
| Warp of Base Plate (After Molding) | No Deformation: ○ Deformed Slightly: △ Deformed: × | × | × | × | × | × | × | × | × |

Fig. 17

|  |  | Comparative Example 7 | Comparative Example 8 | Comparative Example 9 |
|---|---|---|---|---|
| Fin Dimension | Dim. Variations (mm) | ±0.2 | ±0.2 | ±0.2 |
| Distance from Placing Stage to Bottom of Lower Die | Design Height (mm) | 3 | 3 | 3 |
| Bulge Portion | Width (mm) | 0.5 | 0.2 | 2 |
|  | Height (mm) | 0.1 | 0.1 | 0.1 |
|  | Top Shape | Triangle | Triangle | Triangle |
|  | Productivity | ○ | ○ | ○ |
| Contact of Bulge Portion with Die (Sealing Performance) | No Resin Leakage: ○ Partial Resin Leakage: × | × | × | × |
| Warp of Base Plate (After Molding) | No Deformation: ○ Deformed Slightly: △ Deformed: × | × | × | × |

SEMICONDUCTOR DEVICE HAVING A BULGE PORTION AND MANUFACTURING METHOD THEREFOR

TECHNICAL FIELD

The present invention relates to a semiconductor device, and more particularly to a semiconductor device that is equipped with heat dissipating fins.

BACKGROUND ART

In a semiconductor device, semiconductor elements, which are heat generating parts, are mounted. The semiconductor elements generate heat and their temperature become high when the semiconductor device operates. In order to improve heat dissipation of the semiconductor device, a thick metal baseplate or a ceramic baseplate equipped with a circuit pattern is employed as a baseplate for the fixing semiconductor elements. A known configuration is that a fin base equipped with heat dissipating fins is joined to a metal baseplate by screw, to increase the heat dissipating area of the baseplate. An insulative silicone based resin material like grease is intercalated between the fin base and the metal baseplate.

A power semiconductor device with such a configuration needs a step of supplying a silicone-based material to the surface of a metal baseplate or a ceramic baseplate, or a heat dissipating member. Using a silicone-based material not only increases the number of manufacturing steps but also reduces the heat dissipation.

For example, Patent Document 1 is known as it discloses a technique without intercalation of a resin material, in which a ceramic baseplate is mounted on a fin-equipped metal base plate. The semiconductor device is entirely sealed with an epoxy resin. Patent Document 2 deals with a technology distinctive in fin manufacturing methods. Patent Document 3 is distinctive about structure of heat dissipating fins.

PRIOR ART DOCUMENT

Patent Document

Patent Document 1: JP 2009-177038 A
Patent Document 2: JP 2011-119488 A
Patent Document 3: JP 2009-033065 A

SUMMARY OF THE INVENTION

Problem that the Invention is to Solve

A power semiconductor device that is sealed by a transfer molding process is superior in mass productivity and long-term reliability. In order to more improve reliability of the power semiconductor device, a fin-equipped metal baseplate is covered up to its sides with resin. When the fin-equipped metal baseplate is transfer-molded without leaking the sealing resin to the concave and convex portions of the fins, the outer periphery of the metal baseplate needs to be in contact with the molding die. Since the height to the fin top has a dimensional tolerance, a gap is created between the molding die and the fin top by taking the tolerance into account. As a result, deformation of the metal baseplate occurs depending on the temperature and the molding pressure at sealing-resin molding. When a crack is thereby created in the insulation layer, the power semiconductor device reduces in insulation reliability.

The present invention is made to resolve the above-described problem and aims at providing a fin-integrated type semiconductor device that demonstrates a high heat dissipating characteristic and a good quality with a simple structure, and providing a manufacturing method therefor.

Means for Solving the Problem

A semiconductor device according to the present invention includes a base plate having a first major plane and a second major plane opposite to each other, and having a plurality of fins held upright on the first plane and a bulge portion formed thereon to encircle the plurality of fins; an insulation layer formed on the second major plane of the base plate; a circuit pattern fixed to the insulation layer; a semiconductor element connected to the circuit pattern; and a sealing resin sealing the insulation layer, the circuit pattern, and the semiconductor element. The bulge portion formed on the first major plane continuously encircles the plurality of fins.

Advantages of the Invention

According to the present invention, the base plate can be prevented from being deformed to warp by the pressure at sealing-resin molding in the transfer molding process included in the semiconductor device manufacturing process. Furthermore, occurrence of a crack in the insulation layer can be suppressed, improving heat dissipation and insulation reliability of a power semiconductor device.

BRIEF DESCRIPTION OF THE DRAWINGS

FIG. 12 is a table summarizing example conditions and evaluation results of Examples 1 though 8;

FIG. 13 is a table summarizing example conditions and evaluation results of Examples 9 though 16;

FIG. 14 is a table summarizing example conditions and evaluation results of Examples 17 though 24;

FIG. 15 is a table summarizing example conditions and evaluation results of Examples 25 though 32;

FIG. 16 is a table summarizing example conditions and evaluation results of Comparative Examples 1 through 6; and FIG. 17 is a table summarizing example conditions and evaluation results of Comparative Examples 7 through 9.

EMBODIMENTS FOR CARRYING OUT THE INVENTION

Hereinafter, embodiments of semiconductor devices and manufacturing methods therefor according to of the present invention will be described in detail with reference to the drawings. Note that the present invention is not limited to the description below and can be properly modified without departing from the scope and spirits of the present invention.

Embodiment 1

Figure 1:
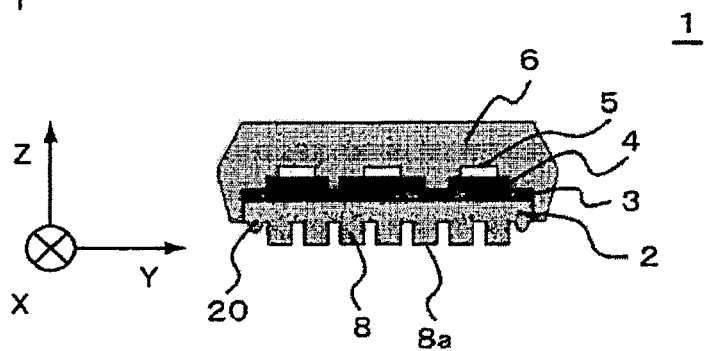
FIG. 1 is a perspective view showing a sectional side of a semiconductor device according to Embodiment 1 of the present invention.

FIG. 1 is a schematic side view showing an overall structure of a semiconductor device 1 according to Embodiment 1 of the present invention. The semiconductor device 1 includes a base plate 2, an insulation layer 3, a circuit pattern 4, semiconductor elements 5, and a sealing resin 6. On the back plane (a first major plane) of the base plate 2, a bulge portion 20 and a plurality of fins 8 are formed. The sealing resin 6 is a molding member made of an epoxy-based resin and covers the base plate 2, the insulation layer 3, the circuit pattern 4, and the semiconductor elements 5. The fins 8 are arranged at given intervals in the Y-direction (thickness direction of the fins).

The base plate 2 serves as a base plate of the semiconductor device 1, and also as heat dissipating fins by being equipped with the fins 8. The base plate 2 is formed of a metal material, such as aluminum or copper, having a high thermal conductivity and excellent heat dissipation characteristics. While a case of using a metal base plate as the base plate 2 is described here, a ceramic baseplate may be used. The fins 8 may originally be formed sufficiently high; however, they are designed to be rather low in Embodiment 1 by taking mass productivity at molding into account.

The insulation layer 3 is formed directly on the surface of the base plate 2. In a case of the insulation layer 3 being an epoxy-based resin, in order to improve heat dissipation, the resin may be mixed with inorganic powder of single substance or a plurality of substances as filler of a high thermal conductivity, such as silica, alumina, boron nitride, and aluminum nitride. The circuit pattern 4 is formed on the insulation layer 3 such as by etching. On the circuit pattern 4, electronic parts such as the semiconductor elements 5 are mounted by soldering or other process.

For the semiconductor elements 5, a semiconductor element that is formed of a wide bandgap semiconductor having a wider band gap than silicon can be preferably used, in addition to that formed of silicon. The wide bandgap semiconductor is formed of, for example, silicon carbide (SiC), a gallium-nitride-based material, or diamond. Employing such a wide bandgap semiconductor for a power semiconductor element can make compact a device that uses the element because its allowable current density is high and its power loss is low.

Figure 2:
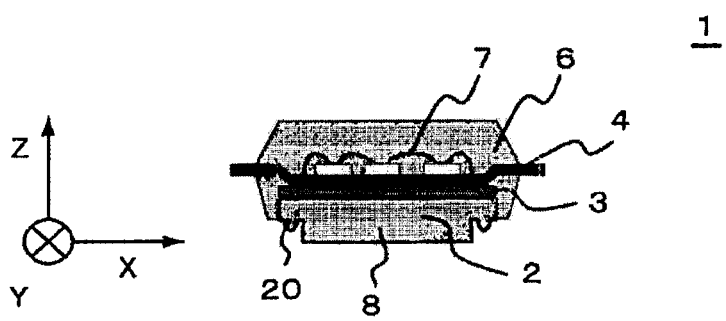
FIG. 2 is a perspective view showing a sectional front of the semiconductor device according to Embodiment 1 of the present invention.

FIG. 2 is a schematic front view showing the overall structure of the semiconductor device 1 shown in FIG. 1. The semiconductor elements 5 are electrically connected to the circuit pattern 4 by bonding wires 7. The sealing resin 6 serves also as a casing of the semiconductor device 1. The sealing resin 6 preferably covers an area of not only the surface of the base plate 2 but also its side faces. Such coverage prevents the semiconductor device 1 from occurrence of a warp and a crack due to thermal stress and leads to reliability improvement. While the material of the sealing resin 6 does not specifically limited, in order to suppress a warp of the semiconductor device 1 as a whole, the sealing resin 6 preferably has a thermal expansion coefficient close to that of copper or the semiconductor elements by being mixed with inorganic powder as filler such as silica.

Figure 3:
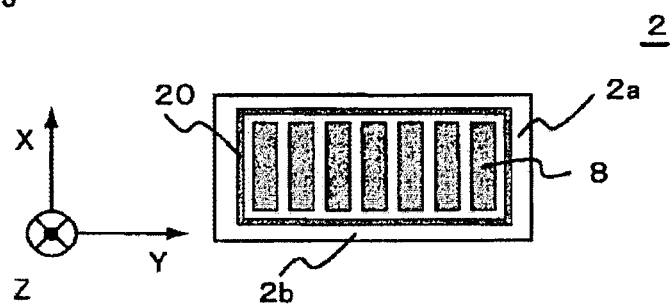
FIG. 3 is a projective view showing the back face of a base plate according to Embodiment 1 of the present invention.

FIG. 3 shows a structure of the base plate 2 according to Embodiment 1 of the present invention. The fins 8 are held upright on a flat plane 2a of the base plate 2 and extend straight in the X-direction (longitudinal direction). The base plate 2 has a widthwise margin 2b formed with a constant width from the outer peripheral edge of the base plate. The bulge portion 20 is formed along the widthwise margin 2b to encircle continuously the entire periphery of the flat plane 2a. By pressing the bulge portion 20 onto the molding die, resin molding can be performed with coverage up to the sides of the base plate 2 without leaking the sealing resin to the fins 8 formed on the back plane of the base plate 2 (see FIG. 5). The bulge portion 20 may be formed in the middle of the widthwise margin 2b, but may be lopsidedly formed either outwards or inwards.

Next, a manufacturing method is described for the above structured semiconductor device 1 according to Embodiment 1. First, on one face of the base plate such as of aluminum, the bulge portion 20 is formed continuously to encircle the entire periphery of the face and the straight fins 8 arranged at given intervals. The material of the bulge portion 20 is not necessarily limited to that of the base plate 2. However, when a metal is employed for the material of the base and the fins are formed by forging the base plate, simultaneous forming of the bulge portion and the fins can reduce the manufacturing cost.

Next, the surface (a second major plane) of the base plate 2 is applied with an epoxy-based resin and the insulation layer 3 is thereby formed. The circuit pattern 4 made of, for example, copper is formed on the insulation layer 3 by etching or other process. A solder paste is applied to predetermined positions on the circuit pattern 4. Electronic parts such as the semiconductor elements 5 are placed on the solder paste, and then reflow soldering is performed. That is, the base plate 2 with the fins 8 and the bulge portion 20 is heated to high temperature to melt the applied solder paste under the high temperature, so that the electronic parts such as the semiconductor elements 5 are electrically connected with the circuit pattern 4. The semiconductor elements 5 are electrically connected to the circuit pattern 4 with bonding wires 7.

Figure 4:
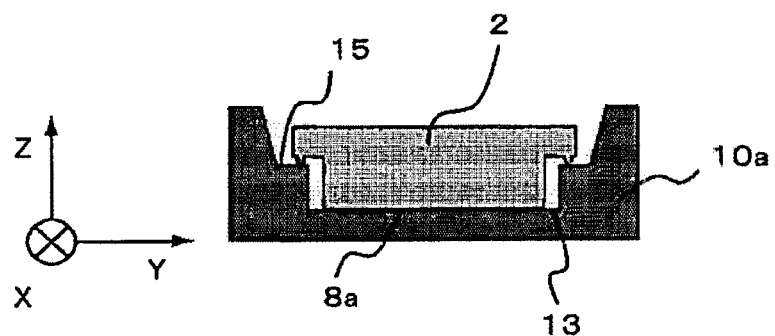
FIG. 4 is a view showing a structure of a molding die and the base plate according to Embodiment 1 of the present invention.

Next, the whole of the insulation layer 3, the circuit pattern 4, the semiconductor elements 5, and the like is sealed by transfer molding. Another procedure is also conceivable in which a sealing resin is injected after the circuit pattern 4 having the semiconductor elements 5 connected thereto is mounted on the base plate 2 having the insulation layer 3 formed thereon. In transfer molding, encapsulation by resin is performed using a molding die. A molding die 10 is constituted with a lower die 10a and an upper die 10b (see FIG. 5). FIG. 4 shows a relationship between the lower die 10a and the base plate 2. The lower die 10a has a carved bottom 13 formed therein and a placing stage 15 formed at a higher position than the bottom 13. Since the base plate 2 is manufactured such as by extrusion molding or forging of aluminum for low cost, the overall size including the fins involves a tolerance. The fins 8 and the lower die 10a are designed to create a gap between the top 8a of the fins and the bottom 13. The bulge portion 20 comes into contact with the placing stage 15 of the lower die 10a when the base plate 2 is placed in the molding die 10.

The bulge portion 20 is formed to prevent the sealing resin from leaking to the back side of the base plate 2 when the base plate 2 is placed in the molding die 10; hence it is essential for the bulge portion to come into continuous contact with the molding die 10. For that reason, the bulge portion 20 is characterized as being continuously formed with no breaks around the fins 8. The bulge portion 20, while its size and the shape are not limited if its height and width are in a small range with respect to the fins 8, has such a size and a shape that the top of the bulge portion 20 is deformed by a force smaller than a resin-molding pressure force that deforms, for example, warps the whole base plate 2.

Figure 5:
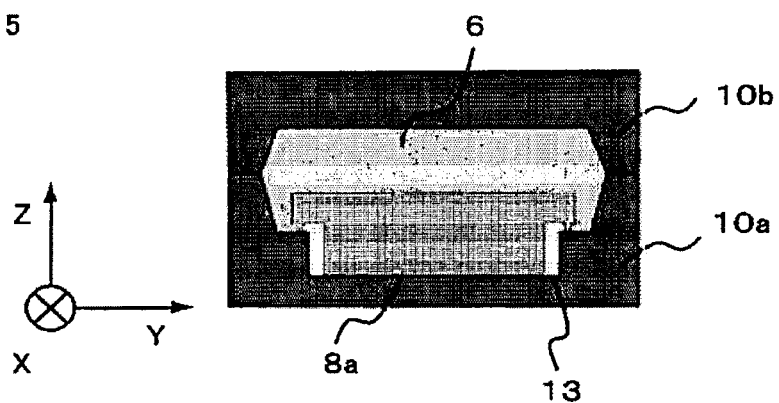
FIG. 5 is a perspective side view of the semiconductor device according to Embodiment 1 of the present invention at resin molding.

No upper limit is set for the height of the bulge portion 20 as long as it has a shape deformable by the pressure at molding the base plate 2. As for a lower limit of the height, when the fins has a maximum height within the dimensional tolerance at manufacturing, a guideline for the height is such that the top of the bulge portion is in contact with the molding die when the base plate is placed in the molding die. The height of the bulge portion 20 needs to be set at least to a value larger than the guideline height. For example, by assuming that the base plate 2 has a maximum fin height within the dimensional tolerance, the bulge portion 20 is designed so that its top is brought into contact with the molding die. Thus, the bulge portion 20 can prevent, as shown in FIG. 5, the sealing resin from leaking to the back side of the base plate 2 at resin molding.

Figure 6:
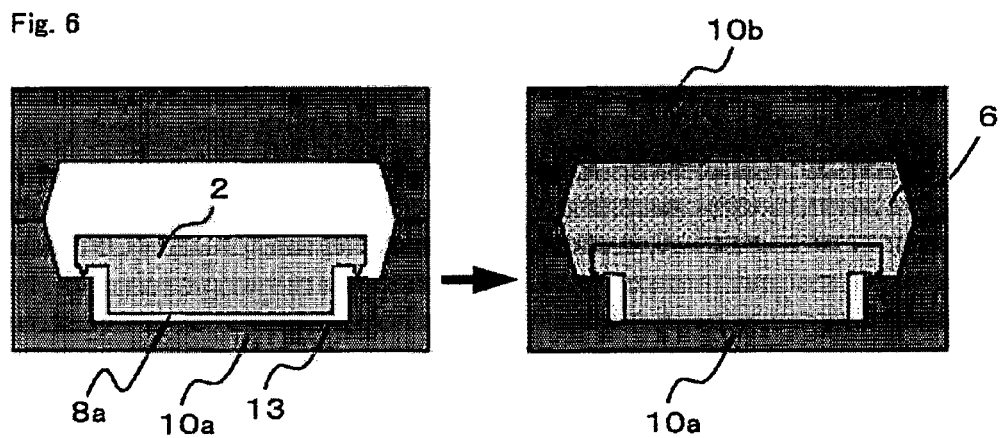
FIG. 6 is a view showing how a bulge portion on the base plate is squashed at resin molding the semiconductor device.

When the fin height is a minimum within the dimensional tolerance, on the other hand, the top 8a of the fins 8 floats from the molding die because a gap is created therebetween, as shown in FIG. 6. The base plate is held in position by contact of the bulge portion 20 with the molding die. Squashing of the bulge portion 20 by the temperature and pressure at the resin molding puts the top 8a of the fins 8 into contact with the whole bottom 13 of the molding die. The base plate can be thereby prevented from deformation such as a warp at resin molding.

At the resin sealing, the epoxy-based resin may be injected under a reduced pressure. This makes it possible to suppress void generation occurring in the epoxy-based resin. The injected epoxy-based resin is cured by being heated to the molding die temperature and can be released from the molding die 10. After that, heat treatment may be undergone as necessary to advance the curing further by, for example, an oven.

A base plate according to Embodiment 1 has a continuous bulge portion formed on the outer periphery of the back plane where fins are formed. Resin sealing is performed using a molding die that is designed to create a certain amount of gap between the fin top and the bottom of the molding die. Since the bulge portion is deformed earlier than the base plate at the molding, deformation such as a warp of the base plate can be curved to a minimum amount. This allows for suppressing significantly occurrence of a crack and a separation of the insulation layer after the power semiconductor device is sealed with an epoxy-based resin, thus obtaining a power semiconductor device that is improved in long-term reliability.

Embodiment 2

Figure 7:
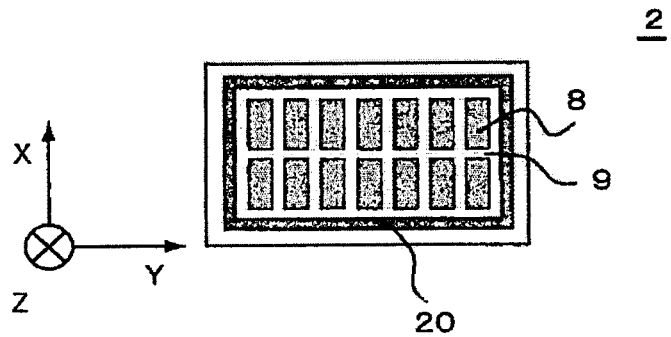
FIG. 7 is a projective view showing the back face of a base plate according to Embodiment 2 of the present invention.
Figure 8:
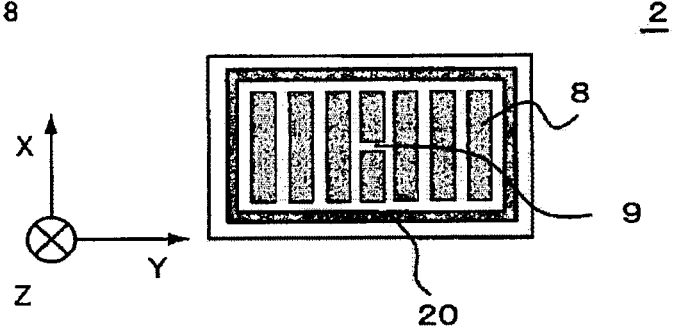
FIG. 8 is a projective view showing the back face of another base plate according to Embodiment 2 of the present invention.

In a semiconductor device according to Embodiment 2, the fins 8 have slits 9 formed therein as shown in FIG. 7. The slits 9 penetrate through the plurality of fins 8 in the Y-direction and the top side of the fins is thereby opened. The bottoms 9a of the slits 9 are set at the same level as the flat plane 2a of the base plate 2. The plurality of respective slits 9 penetrate straight through the plurality of arranged fins 8. While the entire penetration of the slits 9 in the Y-direction demonstrates more positively the effect of the present invention, a partial penetration may be also effective (see FIG. 8). The slits 9 are preferably formed in the middle position of the base plate 2 because the formation near the middle is effective in suppressing deformation at resin molding. However, the position is not specifically limited. The number of penetration lines of the slits 9 is preferably one taking heat dissipation into consideration; however, a plurality of lines may be formed because forming multiple lines of slits increases the effect of suppressing deformation of the base plate 2 at resin molding.

Figure 9:
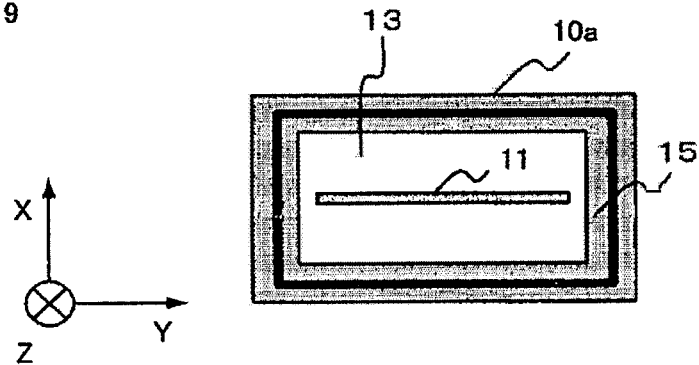
FIG. 9 is a projective view showing a structure of a molding die according to Embodiment 2 of the present invention.
Figure 10:
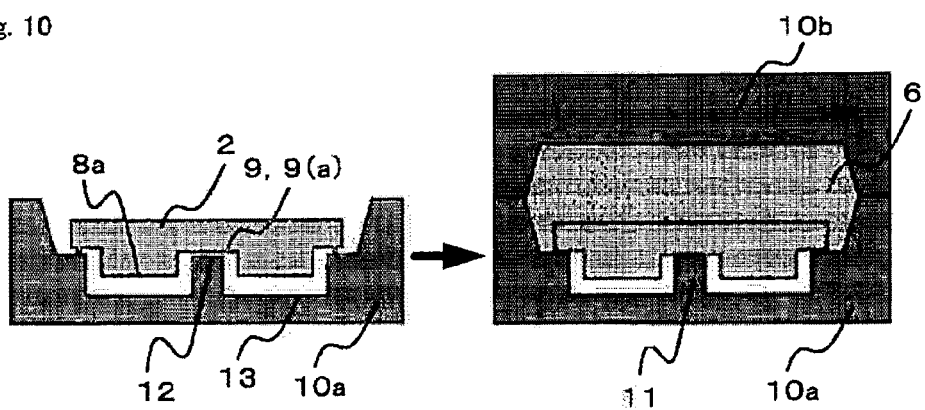
FIG. 10 is a perspective side view of the semiconductor device according to Embodiment 1 of the present invention at resin molding.

FIG. 9 shows a shape of the molding die used for the transfer molding. An upright wall 11 is formed on the bottom 13 of the lower die 10a of the molding die 10 and stands at a position corresponding to slits 9. The base plate is placed in the molding die 10 as shown in FIG. 10, and then the sealing resin is injected into the molding die. There may be created a minimal gap between the top 12 of the upright wall 11 and the slit bottoms 9a. It is preferable for the transfer molding process that the slits 9 have a depth for their bottoms 9a to be the same level as the flat plane 2a of the base plate 2.

Embodiment 2 has a feature in that a base plate having a slit structure is employed. By supporting the slit structure by the molding die, the deformation amount of the base plate can be minimized against the pressure at molding. In comparison with a conventional semiconductor device, occurrence of a crack and a separation of the insulation layer is significantly suppressed after the epoxy-based resin sealing, improving long-term reliability. Moreover, forming slits in the direction orthogonal to the longitudinal direction of the fins can prevent the metal base plate from being deformed at molding without reducing the number of convex shaped portions of the fins contributing to heat dissipation, thus minimizing reduction of heat dissipation also for the final product.

Embodiment 3

While the fins 8 formed on one face of the base plate 2 may be used simply as a heat dissipating fin, it is conceivable to heighten the fins 8 in order to enhance the heat dissipating performance of the fins. Simply heightening the fins 8 not only reduces processing accuracy of the base plate 2 but also causes the fin forming itself to be difficult. Moreover, in the manufacturing process, the lower die 10a needs to be deeply carved in accordance with the height of the fins 8 of the base plate 2. Plus the molding die itself is upsized, leading to reduction of productivity. In order to solve those difficulties, a joint structure is employed in Embodiment 3 for the heat dissipating fins.

Figure 11:
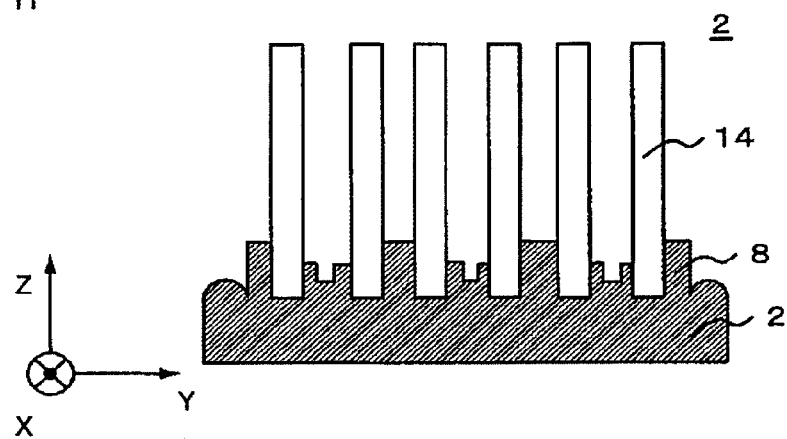
FIG. 11 is a view showing a structure of a base plate according to Embodiment 3 of the present invention.

FIG. 11 is a diagram for explaining the joint structure of the fins. Joint fins 14 made such as of aluminum are fitted into the fins 8 described in Embodiment 1 after the sealing-resin molding, whereby the fin 8 and the joint fin 14 are integrated into one piece, thus increasing the heat dissipating area of the fins and obtaining a semiconductor device of higher heat dissipation. It is preferable to use an epoxy-based resin as the sealing resin 6 that has mechanical strength such a degree that it does not break against a stress caused by a pressing pressure at the fitting.

When SiC is employed for the semiconductor elements 5, in order to take advantage of its characteristic, the semiconductor device 1 is operated at a higher temperature comparing with that equipped with Si elements. For a semiconductor device equipped with SiC elements, higher reliability is demanded as a semiconductor device. Accordingly, a merit of the present invention that is to realize a semiconductor device of high reliability becomes more effective.

Note that each embodiment of the present invention may be freely combined and/or appropriately modified and/or omitted within the scope and spirit of the invention.

A power semiconductor device sometimes needs a process of supplying a resin material such as silicon-based grease to the surface of a metal baseplate or a ceramic baseplate, or a heat dissipating member. Using silicon-based grease not only increases manufacturing steps but also reduces heat dissipation because silicon-based grease has a thermal conductivity lower than those of a metal baseplate and a metal base plate. Additionally, in a transfer-molded type module that employs an insulation sheet as its insulation layer, the insulation sheet is densely mixed with high thermal conductive filler to increase the thermal conductivity. In order to achieve a desired thermal conductivity, transfer molding needs a high molding pressure. For example, a pressure of 100 kg/cm$^2$ is used when sealing by transfer molding, to ensure the performance of the insulation sheet mixed densely with the filler.

In order to transfer-mold the fin-equipped metal base plate without leaking the sealing resin to the concave and convex portions of the fins, the outer periphery of the metal base plate needs to be in tight contact with the molding die. When the outer periphery of the metal base plate comes into contact with the molding die, the peripheral portion becomes a sealing face, whereby the sealing resin is prevented from leaking to the concave and convex portions of the fins. Various methods of manufacturing a fin-equipped heat-dissipating base plate are conceivable. A fin-equipped metal base plate can also be manufactured with high dimensional accuracy by machining. A manufacturing method with high productivity and low cost includes extrusion molding, forging, and die casting. However, a fin-equipped metal base plate manufactured by such a method varies in its shape of the concave and convex portions and has a lower dimensional accuracy in comparison with that manufactured by machining.

Specifically, a fin-equipped metal base plate manufactured by a method such as extrusion molding has a non-negligible dimensional tolerance in the height to the fin top. Here, molding by using a die is considered, in which the die is designed so as to come into contact with not only the sealing face but also the top of convex portions of the fins. If a fin-equipped metal base plate has a fin higher than expected, a gap is created between the sealing face and the die by contact of the fin top with the die. This leads to leakage of the sealing resin from the gap at molding and to a sealed state such that the resin leaks to the concave and convex portions of the fins.

When a ceramic baseplate is employed as the base plate 2, metal heat-dissipating fins can be joined to the ceramic baseplate by, for example, soldering. According to the present invention, while the fins 8 may originally be formed sufficiently high, they are designed to be rather low in Embodiment 1 taking mass productivity at molding into account. A high thermally-conductive metal such as aluminum or copper is employable as a metal base plate. Such a high thermally-conductive metal almost has a Vickers' hardness (Hv) of less than 200 and is easy to deform by molding pressure.

The height of the bulge portion 20 need not be constant and may have a non-uniform shape throughout its circumference. For example, the top of the bulge portion 20 becomes in some cases a squashed shape at a part of or throughout its circumference after molding. A part of the top may be deformed after it comes into contact with the placing stage by receiving the resin molding pressure. The base plate 2 has a size of, for example, 50 by 70 mm, and a thickness of 5 mm at the periphery of the widthwise margin 2b and a thickness of 10 mm including the convex portions of the fins. While a base plate having an outer size larger than 50 mm tends to deform to a warp, the present invention is not limited to this size.

A complimentary description is made of an upper and a lower limit of height of the bulge portion 20. When the bulge portion is high, the sealing resin enters into the space between the base plate and the placing stage of the molding die, thus leading to a lock structure that the base plate is not pulled out from the sealing resin if the base plate remains in the range of no deformation. This brings about an effect that the base plate is hard to separate from the sealing resin, for example when a thermal stress is generated in a reliability test. The lower limit of height of the bulge portion varies depending on dimensional accuracy achieved by a manufacturing method for the fin base. In other words, adjusting the height of the bulge portion makes it possible to use a fin base plate that is manufactured by a method having low dimensional accuracy.

The bulge portion 20 does not need to be squashed evenly throughout its circumference. For example, even if the base plate has variations in inclination and/or its thickness, the bulge portion accommodates the variations as with cushion material. Since the squashed amount varies depending on a part of the bulge portion, the molding can be performed without resin leakage.

Since the heights of the concave and convex portions of the fins 8 vary from fins to fins, when the slits 9 are not formed in the fins 8, the gap between the fin top and the die bottom needs to be determined by taking the variations into account. When the slits 9 are formed and the upright wall 11 is formed on the lower die 10a, on the other hand, only variations due to the dimensional tolerance between the sealing face of the base plate 2 and bottoms of the slits 9 may be taken into account. The gap between the fin top and the die can be designed to be narrower in comparison with the case of not forming the slits 9. This curbs the lower limit of height of the bulge portion, thus allowing for using a cheaper base plate.

The epoxy-based resin injected into the molding die in the transfer molding process is cured by being heated at a molding temperature. For example, in-process goods are retained at a specified temperature for two minutes and then released from the molding die. At this time, it is convenient to push an ejector pin, which is provided aside from the upright wall 11 formed in the die, against the metal base plate. The ejector pin is kept in a movable state to help the releasing from the molding die.

Next, the effects of the present invention are demonstrated by contrastively describing Examples 1 through 32 and Comparative Examples 1 through 9. Example conditions and evaluation results are summarized in FIGS. 12 through 16. FIG. 12 is a table summarizing example conditions and evaluation results of Examples 1 through 8; FIG. 13 is a table summarizing example conditions and evaluation results of Examples 9 through 16; FIG. 14 is a table summarizing example conditions and evaluation results of Examples 17 through 24; FIG. 15 is a table summarizing example conditions and evaluation results of Examples 25 through 32; FIG. 16 is a table summarizing example conditions and evaluation results of Comparative Examples 1 through 6; and FIG. 17 is a table summarizing example conditions and evaluation results of Comparative Examples 7 through 9.

Example 1

An aluminum base plate of 50 mm long, 100 mm wide, and 5 mm thick was used. An epoxy-based resin insulation layer of 0.2 mm thick was laminated over the surface of the aluminum base plate, and fins of 40 mm in length, 2 mm in thickness, and 3 mm in height were formed on the back plane so as to be arranged in the Y-direction. The fin height was 8 mm including the thickness of the aluminum base plate. A convex bulge portion was continuously formed at approximately 1 mm inside from the peripheral edges of the aluminum base plate. The bulge portion was 1 mm in width and 0.5 mm in height. The top of such a bulge portion is deformed by a molding pressure of transfer molding. The top of the bulge portion here was formed in a sharp triangular shape before transfer molding so as to be easily deformed by the molding pressure.

This aluminum base plate was placed into a molding die having a 3 mm-height step formed thereinside. The aluminum base plate having the 3 mm-height fins formed in accordance with the design value came into contact with the upper stage of the step of the molding die, so that the 3 mm-height fins were brought into a state of floating by 0.5 mm above from the molding die. If the fins have a dimensional tolerance of up to +0.5 mm with respect to the 3 mm-design height, a gap is created, when the aluminum base plate is placed into the molding die, by an amount corresponding to the dimensional tolerance, whereby the fins are placed in a floating state. After the aluminum base plate equipped with the insulation layer, the circuit pattern, the semiconductor elements, and the like was placed into the molding die, the rein sealing was performed by the transfer molding with the molding die.

The resin molding was performed under a die temperature of 180° C. and a molding pressure of 100 kg/cm². Consequently, the continuous bulge portion formed on the back plane of the aluminum base plate was squashed by the molding pressure. Sinking down of the aluminum base plate brought the 3 mm-design-height fins into contact with the molding die. However, a deformation such as a warp of the whole base plate did not occur. For the power semiconductor device fabricated by the above process, aluminum joint fins of 50 mm in height made of an aluminum plate of approximately 0.2 mm thick were fitted into the fins by pressing.

A minimum value of the bulge portion height varies also depending on a dimensional tolerance range of the fins of the aluminum base plate. Since the manufacture dimensional tolerance of the aluminum base plate varies depending on a manufacturing method such as extrusion molding and forging of aluminum, the height of the continuous bulge portion may be determined according to the manufacturing method. In the aluminum base plate having such a size in shape as shown here, it was confirmed that when the size of the bulge portion measures up to approximately 0.5 mm in width and 1 mm in height, a warp of the aluminum base plate at molding was suppressed and a leakage of the resin was prevented while the bulge portion was squashed owing to the dimensional tolerance. The insulation reliability of the completed power semiconductor device could be thereby ensured.

Example 2

An aluminum base plate of 50 mm long, 100 mm wide, and 5 mm thick was used. An epoxy-based resin insulation layer of 0.2 mm thick was formed on the surface of the aluminum base plate, and fins of 40 mm in length, 2 mm in thickness, and 3 mm in height were formed on the back plane so as to be arranged in the Y-direction. The fin height was 8 mm including the thickness of the aluminum base plate. Note that dimensional variations of the aluminum base were ±0.05 mm with respect to 8 mm that was the height from the insulation-layer formed surface to the fin top. A convex bulge portion was continuously formed at approximately 1 mm inside from the peripheral edges of the aluminum base plate. The bulge portion was 0.5 mm in width and 0.1 mm in height. The top of such a bulge portion is deformed by a molding pressure of transfer molding. The top of the bulge portion here was formed in a triangular shape before the transfer molding so as to be easily deformed by the molding pressure.

This aluminum base plate was placed into a molding die designed to have 3 mm distance from the placing stage to the bottom of the lower die. The aluminum base plate having the 3 mm-height fins formed in accordance with the design value came into contact with the placing stage of the molding die, so that the fin top was brought into a state of floating by 0.5 mm above from the lower die bottom. Checking for respective cases with the upper and lower limits of the dimensional tolerance showed that 3.05 mm-height fins were in a state of floating by 0.45 mm and 2.95 mm-height fins were in a state of floating by 0.55 mm.

After the aluminum base plate equipped with the insulation layer, the circuit pattern, the semiconductor elements, and the like was placed into the molding die, the rein sealing was performed by the transfer molding with the molding die. The resin molding was performed under a die temperature of 180° C. and a molding pressure of 100 kg/cm². Consequently, the continuous bulge portion formed on the back plane of the aluminum base plate was squashed by the molding pressure. The tight contact of the bulge portion with the placing stage throughout their circumferences increased sealing performance, whereby no resin leakage occurred. Sinking down of the aluminum base plate brought the 3 mm-design-height fins into contact with the molding die. A deformation such as a warp of the whole base plate did not occur in the semiconductor device. The triangular shaped top of the bulge portion became a squashed shape by the molding process. While the squashed degree of the bulge portion was in some cases uneven throughout its circumference depending on variations in an initial warp of the whole base plate and its thickness, there occurred no particular problem concerning with prevention of resin leakage.

For the power semiconductor device fabricated by the above process, aluminum joint fins of 50 mm in height made of an aluminum plate of approximately 0.2 mm thick were fitted into the fins by pressing. No separation and no crack of the insulation layer were found in the semiconductor device thus fabricated and it was confirmed that the insulation reliability as a semiconductor device was satisfied. Dimensional tolerance of the fins and dimensional variations of the bulge portion and like depend on fabricating methods. Even when the fins were fabricated of aluminum, the dimensional variations differed depending on a fabricating method such as die casting, extrusion molding, and forging. Additional machining is performed with a high cost allows for manufacturing the fins with the variations significantly curbed. Hence, the size of the continuous bulge portion was determined, as the following examples, in correspondence with the degree of the dimensional variations.

Example 3

In this example, an aluminum base plate was used that has the same size as that used in Example 2. Dimensional variations of the fins were similar to that in Example 2. The bulge portion was formed to have a height of 0.2 mm. The bulge portion was basically the same as with Example 2 except for its height. It was confirmed that in the semiconductor device having the same structure and fabricated through the same transfer molding process as with Example 2, there was no occurrence of a resin leakage at molding and of a separation and a crack of the insulation layer due to deformation of the base plate, and the insulation reliability as a semiconductor device was satisfied.

Example 4

This example differs, compared to Example 3, in that the bulge portion was formed to have a height of 0.5 mm. All such as the fin structure, the fabricating method, and results thereby obtained were the same as with Example 3.

Example 5

This example differs, compared to Example 3, in that the bulge portion was formed to have a height of 1 mm. All such as the fin structure, the fabricating method, and results thereby obtained were the same as with Example 3.

Example 6

This example differs, compared to Example 3, in that the bulge portion was formed to have a height of 2 mm. All such as the fin structure, the fabricating method, and results thereby obtained were the same as those of Example 3. Focusing attention on the shape of the bulge portion, its height was 2 mm for 0.5 mm width. However, the productivity was evaluated as "Δ" because the ratio of the height to the width was large and the bulge portion was accordingly hard to manufacture stably and at low cost. No leakage of the resin and no deformation of the base plate were confirmed, and function and reliability as a semiconductor device were satisfied.

Example 7

This example differs, compared to Example 4, in that the top of the bulge portion was formed to have a half-circle shape. All such as the fin structure, the fabricating method, and results thereby obtained were the same as with Example 4.

Example 8

This example differs, compared to Example 4, in that the top of the bulge portion was formed to have a rectangular shape. All such as the fin structure, the fabricating method, and results thereby obtained were the same as with Example 4.

Example 9

This example differs, compared to Example 2, in that the bulge portion was formed to have a height of 0.2 mm. All such as the fin structure, the fabricating method, and results thereby obtained were the same as with Example 2.

Example 10

This example differs, compared to Example 9, in that the bulge portion was formed to have a height of 0.5 mm. All such as the fin structure, the fabricating method, and results thereby obtained were the same as those of Example 9. However, the productivity was evaluated as "Δ" as with Example 6 because the ratio of the height of the bulge portion to its width was large. No resin leakage and no base plate deformation were confirmed, and function and reliability as a semiconductor device were satisfied.

Example 11

This example differs, compared to Example 9, in that the bulge portion was formed to have a height of 1 mm. All such as the fin structure, the fabricating method, and results thereby obtained were the same as with Example 9. However, the productivity was evaluated as "Δ" as with Example 6 because the ratio of the height of the bulge portion to its width was large. No resin leakage and no base plate deformation were confirmed, and function and reliability as a semiconductor device were satisfied.

Example 12

This example differs, compared to Example 2, in that the bulge portion was formed to have a height of 2 mm. All such as the fin structure, the fabricating method, and results thereby obtained were the same as with Example 2.

Example 13

This example differs, compared to Example 12, in that the bulge portion was formed to have a height of 0.5 mm. All such as the fin structure, the fabricating method, and results thereby obtained were the same as with Example 12.

Example 14

This example differs, compared to Example 12, in that the bulge portion was formed to have a height of 1 mm. All such as the fin structure, the fabricating method, and results thereby obtained were the same as with Example 12.

Example 15

This example differs, compared to Example 14, in that the top of the bulge portion was formed to have a half-circle shape. The fin structure and the fabricating method were the same as with Example 14. As a result, no occurrence of a resin leakage and of a separation and a crack of the insulation layer was confirmed. However, forming the fin top in a half-circle shape slightly worsened the squashed degree of the fine. Squashing of the bulge portion occurred partially. While the base plate was warped slightly, no problem in reliability as a semiconductor device was confirmed.

Example 16

This example differs, compared to Example 14, in that the bulge portion was formed to have a height of 2 mm. The fin structure and the fabricating method were the same as with Example 14. As a result, no occurrence of a resin leakage and of a separation and a crack of the insulation layer was confirmed. However, squashing of the bulge portion was imperfect when the bulge portion was wider and higher. While a slight warp was found in the base plate, no problem in reliability as a semiconductor device was confirmed.

Example 17

In Examples 17 thought 25, an aluminum base plate was used that was manufactured by a method having a relatively high finishing accuracy, such as machining. The fin structure including the shape of the bulge portion was equivalent to that in Examples 2. No occurrence of a resin leakage at molding, and of a separation and a crack of the insulation layer due to deformation of the base plate was confirmed and it was also confirmed that the insulation reliability as a semiconductor device was satisfied.

Example 18

This example differs, compared to Example 17, in that the bulge portion was formed to have a height of 1 mm. All such as the fin structure, the fabricating method, and results thereby obtained were the same as with Example 17.

Example 19

This example differs, compared to Example 17, in that the bulge portion was formed to have a height of 2 mm. All such as the fin structure, the fabricating method, and results thereby obtained were the same as with Example 17. However, the productivity was evaluated as "Δ" as with Example 6 because the ratio of the height of the bulge portion to its width was large. No resin leakage and no base plate deformation were confirmed, and function and reliability as a semiconductor device were satisfied.

Example 20

In this example, the fin structure including the shape of the bulge portion was equivalent to that in Example 9. However, an aluminum base plate was used that was manufactured by a method having a relatively high finishing accuracy, such as machining. No occurrence of a resin leakage at molding and of a separation and a crack of the insulation layer due to deformation of the base plate was confirmed, and the insulation reliability as a semiconductor device was satisfied.

Example 21

This example differs, compared to Example 20, in that the bulge portion was formed to have a height of 1 mm. However, the productivity was evaluated as "Δ" as with Example 6 because the ratio of the height of the bulge portion to its width was large. No resin leakage and no base plate deformation were confirmed, and function and reliability as a semiconductor device were satisfied.

Example 22

This example differs, compared to Example 20, in that the bulge portion was formed to have a height of 2 mm. However, the productivity was evaluated as "Δ" as with Example 6 because the ratio of the height of the bulge portion to its width was large. No resin leakage and no base plate deformation were confirmed, and function and reliability as a semiconductor device were satisfied.

Example 23

In this example, the top of the fins was formed to have a half-circle shape and the bulge portion was formed to have a width of 2 mm. As a result, no occurrence of a resin leakage and of a separation and a crack of the insulation layer was confirmed. However, forming the fin top in a half-circle shape slightly worsened the squashed degree of the fins. While the base plate was warped slightly, no problem in reliability as a semiconductor device was confirmed.

Example 24

In this example, the top of the fins was formed to have a triangular shape and the bulge portion was formed to have a width of 1 mm. All such as results thereby obtained were the same as with Example 23.

Example 25

This example differs, compared to Example 24, in that the bulge portion was formed to have a height of 2 mm. All such as the fin structure, the fabricating method, and results thereby obtained were the same as with Example 24.

Example 26

In Examples 26 thought 32, an aluminum base plate was used that was manufactured by an extrusion molding method having a relatively low dimensional accuracy. The fin structure including the shape of the bulge portion was equivalent to that in Examples 3. Thereby, no occurrence of a resin leakage at molding and of a separation and a crack of the insulation layer due to base plate deformation was confirmed, and it was also confirmed that the insulation reliability as a semiconductor device was satisfied.

Example 27

This example differs, compared to Example 26, in that the bulge portion was formed to have a height of 1 mm. All such as the fin structure, the fabricating method, and results thereby obtained were the same as with Example 26.

Example 28

This example differs, compared to Example 26, in that the bulge portion was formed to have a height of 2 mm. However, the productivity was evaluated as "Δ" as with Example 6 because the ratio of the height of the bulge portion to its width was large. No resin leakage and no base plate deformation were confirmed, and function and reliability as a semiconductor device were satisfied.

Example 29

In this example, the bulge portion was formed to have a width of 0.2 mm and a height of 1 mm. All such as the fin structure, the fabricating method, and results thereby obtained were the same as with Example 28.

Example 30

This example differs, compared to Example 28, in that the bulge portion was formed to have a width of 0.2 mm. All such as the fin structure, the fabricating method, and results thereby obtained were the same as with Example 28.

Example 31

In this example, the bulge portion was formed to have a width of 2 mm and a height of 1 mm. As a result, no occurrence of a resin leakage and of a separation and a crack of the insulation layer was confirmed. However, squashing of the bulge portion was found only at a part thereof when the bulge portion was wider and higher. While a slight warp was found in the base plate, no problem in reliability as a semiconductor device was confirmed.

Example 32

In this example, the bulge portion was formed to have a width of 2 mm and a height of 2 mm. As a result, no occurrence of a resin leakage and of a separation and a crack of the insulation layer was confirmed. However, squashing of the bulge portion was found, as with Example 31, only at a part thereof when the bulge portion was wider and higher. While a slight warp was found in the base plate, no problem in reliability as a semiconductor device was confirmed.

Comparative Example 1

An aluminum base plate of 60 mm long, 100 mm wide, and 5 mm thick was used. An epoxy-based resin insulation layer of 0.2 mm thick was laminated over the surface of the aluminum base plate, and fins of 40 mm in length, 2 mm in thickness, and 3 mm in height were formed on the back plane so as to be arranged in the Y-direction. The fin height was 8 mm including the thickness of the aluminum base plate. Among the fins, there was included a fin of 3.05 mm in height, which was +0.05 mm in the dimensional tolerance with respect to the design height of 3 mm. Placing the aluminum base plate into a molding die having a 3 mm step formed thereinside resulted in a situation in which the placing stage of the molding die was in no contact with the aluminum base plate throughout its periphery. As a result of molding the resin by transfer molding, a resin leakage to the back side of the base plate occurred.

Comparative Example 2

An aluminum base plate of 50 mm long, 100 mm wide, and 5 mm thick was used. An epoxy-based resin insulation layer of 0.2 mm thick was laminated over the surface of the aluminum base plate, and fins of 40 mm in length, 2 mm in thickness, and 3 mm in height were formed on the back plane so as to be arranged in the Y-direction. The fin height was 8 mm including the thickness of the aluminum base plate. A dimensional tolerance of the aluminum base plate was ±0.05 mm with respect to the height of 3 mm. There were fins having a height between 2.95 mm and 3.05 mm.

A molding die having a step of 3.05 mm or more, into which the aluminum base plate was placed, was prepared so that no resin leakage occurred even when fins having a maximum tolerance dimension was placed. An aluminum base plate including a fin of 2.95 mm in height, which was within the dimensional tolerance, was placed into the molding die to be resin-molded by transfer molding. No resin leakage to the back side of the base plate occurred. However, the middle of the aluminum base plate was pressed to warp by the pressure of the resin molding. As a result of checking the completed semiconductor device for its insulation performance, partial discharge inception voltage decreased, and fine cracks were confirmed in the insulation layer as a result of observing a cross section of the insulation layer.

Comparative Example 3

An aluminum base plate of 50 mm long, 100 mm wide, and 5 mm thick was used. An epoxy-based resin insulation layer of 0.2 mm thick was laminated over the surface of the aluminum base plate, and fins of 40 mm in length, 2 mm in thickness, and 3 mm in height were formed on the back plane so as to be arranged in the Y-direction. The fin height was 8 mm including the thickness of the aluminum base plate. A convex bulge portion was continuously formed at approximately 1 mm inside from the peripheral edges of the aluminum base plate. The bulge portion was 1 mm in width and 0.1 mm in height. The transfer molding was performed for the aluminum base plate. The dimensional tolerance of the fins could not be accommodated for 3 mm-design height of the aluminum base plate, and a resin leakage to the back side of the base plate occurred at transfer molding (Comparative Example 3A).

Likewise, the transfer molding was performed for a case with a bulge portion formed having a width of 1 mm and a height of 1 mm (Comparative Example 3B) and for a case with a bulge portion formed having a width of 3 mm and a height of 0.5 mm (Comparative Example 3C). While no resin leakage to the back side of the base plate occurred at the transfer molding, squashing occurred at the top of the bulge portion when there was included a fin whose height was close to the minimum dimensional tolerance among the 3 mm-design-height fins. However, the deformation amount by the squashing was too large to prevent the aluminum base plate from being warped, and a warp occurred in the metal base plate. The power semiconductor device after transfer molding thereby decreased in insulation performance, and fine cracks in the insulation sheet were confirmed by a cross section observation.

Comparative Example 4

On an aluminum base plates having a dimensional tolerance of ±0.05 mm, a bulge portion having a triangular shaped top of 1 mm in width and 0.02 mm in height was formed. As a result, when fins of 3.05 mm in height, which was the upper limit, were used, a resin leakage to the convex and concave portions in the fin side occurred at molding. When fins of 2.95 mm in height, which was the lower limit, were used, a warp occurred in the aluminum base after molding. Because a separation and a crack of the insulation layer occurred, the insulation reliability as a semiconductor device was not satisfied.

Comparative Example 5

On an aluminum base plates having a dimensional tolerance of ±0.05 mm, a bulge portion having a rectangular shaped top of 1 mm in width and 0.5 mm in height was formed. As a result, no resin leakage occurred at molding; however, a warp occurred in the aluminum base plate. Because a separation and a crack of the insulation layer occurred, the insulation reliability was not satisfied Observation of the bulge portion after the molding showed that the bulge portion was partially squashed by the molding pressure. The bulge portion was unevenly squashed throughout its circumference and a resin leaking part was found.

Comparative Example 6

This comparative example differs, compared to Example 14, in that the bulge portion was formed to have a rectangular shape. The fin structure and the fabricating method were the same as with Example 14. As a result, no resin leakage occurred; however, the insulation reliability decreased owing to occurrence of a separation and a crack of the insulation layer. Observation of the bulge portion after molding showed that the bulge portion has a part squashed by the molding pressure. The bulge portion was unevenly squashed throughout its circumference and a resin leaking part being not well squashed was found.

Comparative Examples 7 Through 9

The transfer molding was performed for aluminum base plates having a bulge portion of 0.1 mm in height. The dimensional tolerance of the base plate was 10.2 mm. In Comparative Example 7, the bulge portion was formed to have a width of 0.5 mm. In Comparative Example 8, the bulge portion was formed to have a width of 0.2 mm. In Comparative Example 9, the bulge portion was formed to have a width of 2 mm. Independently of the widths of the bulge portions, a resin leakage, and a separation and a crack of the insulation layer were confirmed.

NUMERAL REFERENCE

1: semiconductor device, 2: base plate, 2a: flat plane, 3: insulation layer, 4: circuit pattern, 5: semiconductor elements, 6: sealing resin, 7: bonding wires, 8: fins, 8a: top, 9: slits, 9a: bottoms, 10: molding die, 11: upright wall, 13: bottom, 14: joint fins, 15: placing stage, 20: bulge portion.

The invention claimed is:

1. A semiconductor device comprising:
    a base plate having a first major plane and a second major plane opposite to each other, and having a plurality of fins held upright on the first major plane and a bulge portion formed on the first major plane to encircle the plurality of fins;
    an insulation layer formed on the second major plane of the base plate;
    a circuit pattern fixed to the insulation layer;
    a semiconductor element connected to the circuit pattern; and
    a sealing resin sealing the insulation layer, the circuit pattern, and the semiconductor element, wherein
    the bulge portion formed on the first major plane continuously encircles the plurality of fins,
    the base plate has a widthwise margin on an outer peripheral edge of the first major plane of the base plate,
    the bulge portion is formed on the widthwise margin and divides the widthwise margin into an outer widthwise margin arranged outside of the bulge portion and an inner widthwise margin arranged inside of the bulge portion, and
    the sealing resin covers an outer peripheral side face of the bulge portion and the outer widthwise margin.

2. The semiconductor device of claim 1, wherein the plurality of fins are arranged in a certain direction.

3. The semiconductor device of claim 2, wherein each of the plurality of fins has a slit formed therein to penetrate in the thickness direction of the fins.

4. The semiconductor device of claim 3, wherein the respective slits formed in the plurality of fins are arranged in a line.

5. The semiconductor device of claim 1, wherein the insulation layer contains inorganic powder.

6. The semiconductor device of claim 1, wherein a metal plate is fitted into the base plate.

7. The semiconductor device of claim 1, wherein at least part of the semiconductor elements is constituted with a wide bandgap semiconductor.

8. The semiconductor device of claim 7, wherein the wide bandgap semiconductor is a semiconductor formed of any of silicon carbide, a gallium-nitride-based material, and diamond.

9. A method of manufacturing a semiconductor device, the method comprising:
    forming integrally a base plate having a plurality of fins held upright on the base plate and a bulge portion formed on the base plate to encircle continuously the plurality of fins and to have a widthwise margin on an outer peripheral edge of the base plate, the bulge portion being formed on the widthwise margin and dividing the widthwise margin into an outer widthwise margin arranged outside of the bulge portion and an inner widthwise margin arranged inside of the bulge portion;
    fixing a semiconductor element to the base plate;
    placing the base plate into a molding die provided with a placing stage at a position higher than the bottom of the molding die so that the bulge portion is brought into contact with the placing stage with the plurality of fins down;
    injecting a molding resin into the molding die in which the base plate is placed to cover an outer peripheral side face of the bulge portion and the outer widthwise margin; and
    curing the injected molding resin by heating.

10. The semiconductor device of claim 1, wherein the bulge portion has a narrower width at a position closer to its top.

11. The semiconductor device of claim 1, wherein the widthwise margin has a constant width from the outer peripheral edge of the base plate.

12. The semiconductor device of claim 1, wherein the bulge portion is formed in the middle of the widthwise margin.

13. The semiconductor device of claim 1, wherein the outer widthwise margin and the inner widthwise margin have different widths.

* * * * *